United States Patent [19]
Donoghue

[11] Patent Number: 5,554,958
[45] Date of Patent: Sep. 10, 1996

[54] INVERTING AMPLIFIER HAVING A LOW NOISE BIASING NETWORK

[75] Inventor: Bryan J. Donoghue, Filton, England

[73] Assignee: Hewlett Packard Company, Palo Alto, Calif.

[21] Appl. No.: 431,252

[22] Filed: Apr. 28, 1995

[51] Int. Cl.[6] ........................................ M03F 1/26
[52] U.S. Cl. ............................. 330/149; 330/296
[58] Field of Search ................................ 330/149, 261, 330/292, 296

[56] References Cited

FOREIGN PATENT DOCUMENTS 0023668  2/1984  Japan ...................................... 330/296

*Primary Examiner*—Steven Mottola
*Attorney, Agent, or Firm*—Howard R. Boyle

[57] ABSTRACT

An operational amplifier with reduced bias circuit noise. The present invention reduces the noise contribution of the non-inverting input bias circuit. This noise reduction is accomplished by reducing the bandwidth of the bias circuit by bypassing high frequencies to signal ground. This reduces the noise voltage developed across the bias circuit and thereby reduces the noise at the output of the amplifier.

7 Claims, 2 Drawing Sheets

INVERTING AMPLIFIER HAVING A LOW NOISE BIASING NETWORK

FIELD OF THE INVENTION

The present invention relates to solid state signal amplifiers. In particular, this invention relates to a biasing method for operational amplifiers which reduces the noise produced by the non-inverting bias network.

BACKGROUND OF THE INVENTION

Operational amplifiers have been used in the electronics industry for many years. These amplifiers are constructed using integrated circuit methods and are packaged in integrated circuit casings or in packages similar to those used for discrete transistors. They provide an inexpensive and convenient way to amplify signals with a minimum of discrete parts.

When amplifying small signals, care must be taken to minimize circuit noise. As the amplitude of the input signal to an amplifier is decreased, the amount of circuit noise that can be tolerated also decreases. For example, if the input signal voltage is 1 volt peak-to-peak, then a circuit noise level of 100 micro-volts (uV) is of little consequence. However if the input signal voltage is 50 uV, then a circuit noise level of 100 uV swamps out the desired signal making the amplifier useless. Therefore great care is taken to ensure that input voltage noise ($V_{13}$noise) of a small signal operational amplifier is minimized. But other devices also contribute to the circuit noise.

The source, biasing and feedback resistors associated with an amplifier each contribute to the circuit noise due to two phenomena. First there is "Johnson Noise" and second there is noise generated by the input current to the amplifier.

Due to Johnson Noise, each resistor generates a voltage noise equal to "sqrt(4 KTR)" volts per root Hertz (Hz). In the Johnson noise equation, "K" is Boltzman's constant, "T" is the temperature in degrees Kelvin and "R" is the resistance in ohms.

The inputs of an amplifier produce a noise current ($I_{13}$noise). As this noise current flows through resistors attached to the amplifier inputs, a noise voltage is generated across the resistors. The magnitude of the noise voltage is ($I_{13}$noise*R). The noise generated across the input biasing resistor of an inverting amplifier can be a significant or even dominant noise source for the amplifier.

FIG. 1 illustrates a prior art small signal operational amplifier. The operational amplifier 101 has a non-inverting input 103 and an inverting input 105. A biasing resistor "R3" 107 is connected in series between the non-inverting input 103 and a signal ground. A feedback resistor "R2" 109 is connected between the inverting input 105 and an output 111 of the operational amplifier 101. Connected in series between a voltage input source 113 and the inverting input 105 is an input resistor "R1" 115 and a coupling capacitor "C1" 117.

The inputs of an amplifier require an input bias current to ensure a zero direct current (DC) offset voltage at the amplifier output 111. In the example illustrated in FIG. 1, the inverting and non-inverting input bias currents of the amplifier are assumed to be matched. Resistors 107 and 109 are equal, 5000 ohms (5K), to ensure a zero DC offset at the amplifier output due to input bias currents.

The equivalent input noise voltage per root Hz of the circuit for a frequency (f) much greater than determined by the formula "f=½*3.142*C1*R1" is given by the formula:

$$\text{sqrt}(V_{13}\text{noise}^2 + (I_{13}\text{noise}(R1*R2/(R1+R2)))^2 + 4KT(R1*R2/(R1+R2)) + (I_{13}\text{noise}*R3)^2 + 4KT(R3))$$

Since R3 is greater than (R1*R2/(R1+R2)), then the noise contributions of R3 (107) exceed those of R1 (115) and R2 (109). If $V_{13}$noise is small then the noise contributions of the input biasing resistor R3 can be the dominant source of noise in the amplifier.

Two prior art methods have been used to reduce the noise contribution of the non-inverting input resistor. The first method reduces the non-inverting input biasing resistor value and the second method reduces the values of the input, feedback and non-inverting biasing resistor. Both methods have disadvantages.

In the first method, if the non-inverting input bias resistor R3 (107) is reduced, then both the Johnson and input current noise contributions related to R3 are reduced. However, if the value of the input biasing resistor R3 alone is reduced, then it's value will no longer match the DC impedance at the inverting input R2. When the inverting and non-inverting input impedances no longer match at DC, then the input bias currents of the amplifier are no longer compensated and a finite output voltage will result. This is an undesirable result as the output voltage 119 will no longer be zero for a zero input voltage (an output offset voltage is created).

In the second method, if all of the resistors R1, R2 and R3 are all reduced in value, then the input bias currents will still be balanced and the output of the amplifier will still be zero for a zero input voltage. However reducing the input resistor may not be desirable since the input impedance of the amplifier may be too low for the input voltage source.

Therefore what is needed in the industry is a method for reducing the noise contribution from the non-inverting bias resistor without decreasing the input impedance of the amplifier or creating an offset output voltage.

SUMMARY OF THE INVENTION

The present invention reduces the noise contribution of the non-inverting input bias circuit. This noise reduction is accomplished by reducing the bandwidth of the bias circuit. The bias circuit is designed to have low bandwidth so that at high frequencies, the impedance of the circuit is low. Therefore, less noise voltage develops across the circuit and there is less overall system noise.

To effect the desired reduction in bandwidth, a high frequency bypass device is placed in parallel with the non-inverting input bias circuit. Typically, this device is a capacitor appropriately sized to present a low impedance at high frequencies. Since this is a parallel circuit, the lowest impedance parallel component, in this case the capacitor, determines the maximum impedance as seen from the non-inverting input. So the maximum noise voltage that can be generated is determined by the impedance of the capacitor which is much less than the impedance of the non-inverting bias network alone.

This bypass method provides for a low non-inverting input noise level while eliminating the need to either lower the amplifier input resistance or creating an output offset voltage.

DETAILED DESCRIPTION OF THE INVENTION

Figure 1:
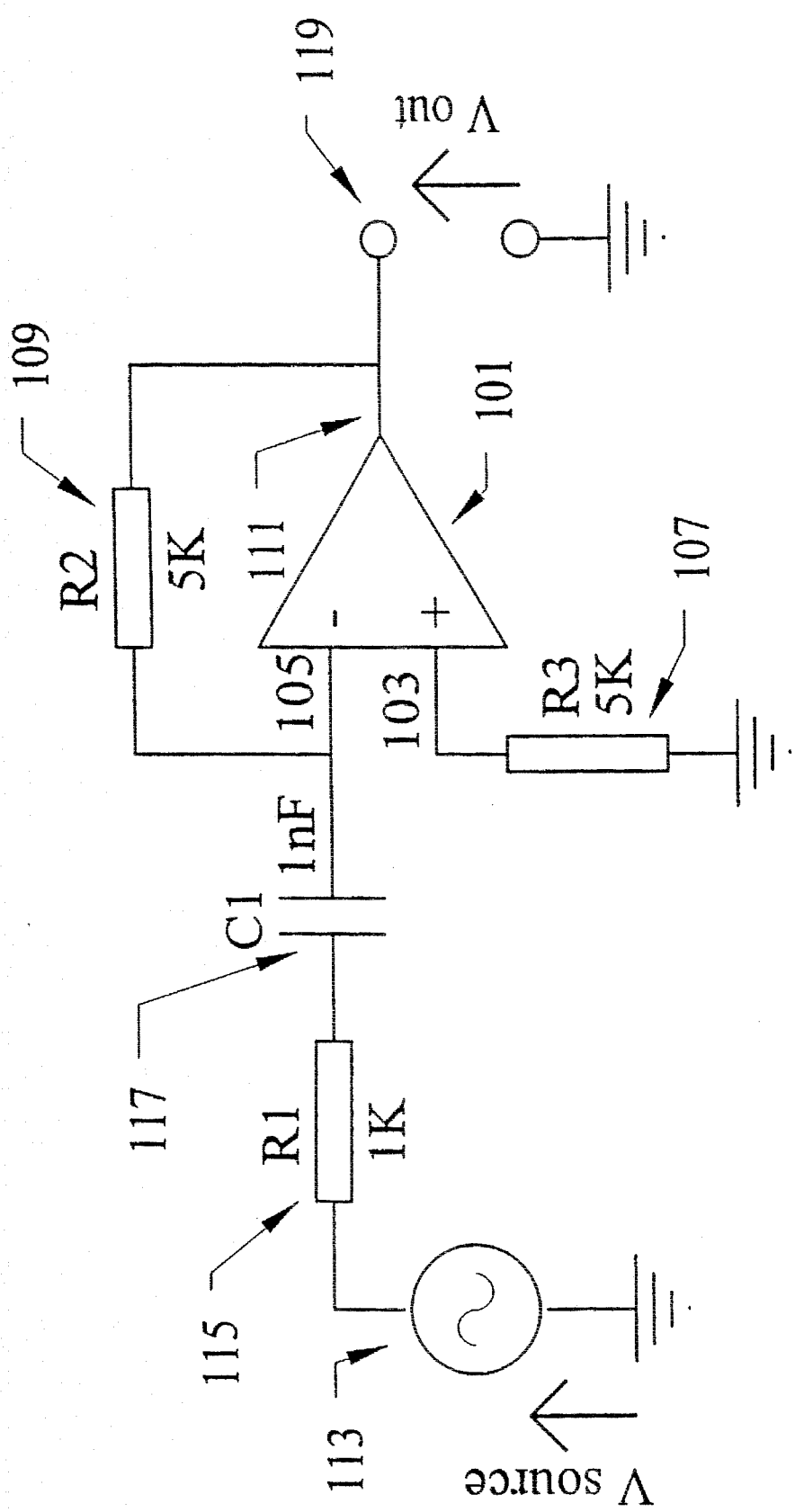
FIG. 1 illustrates a prior art inverting operational amplifier circuit.
Figure 2:
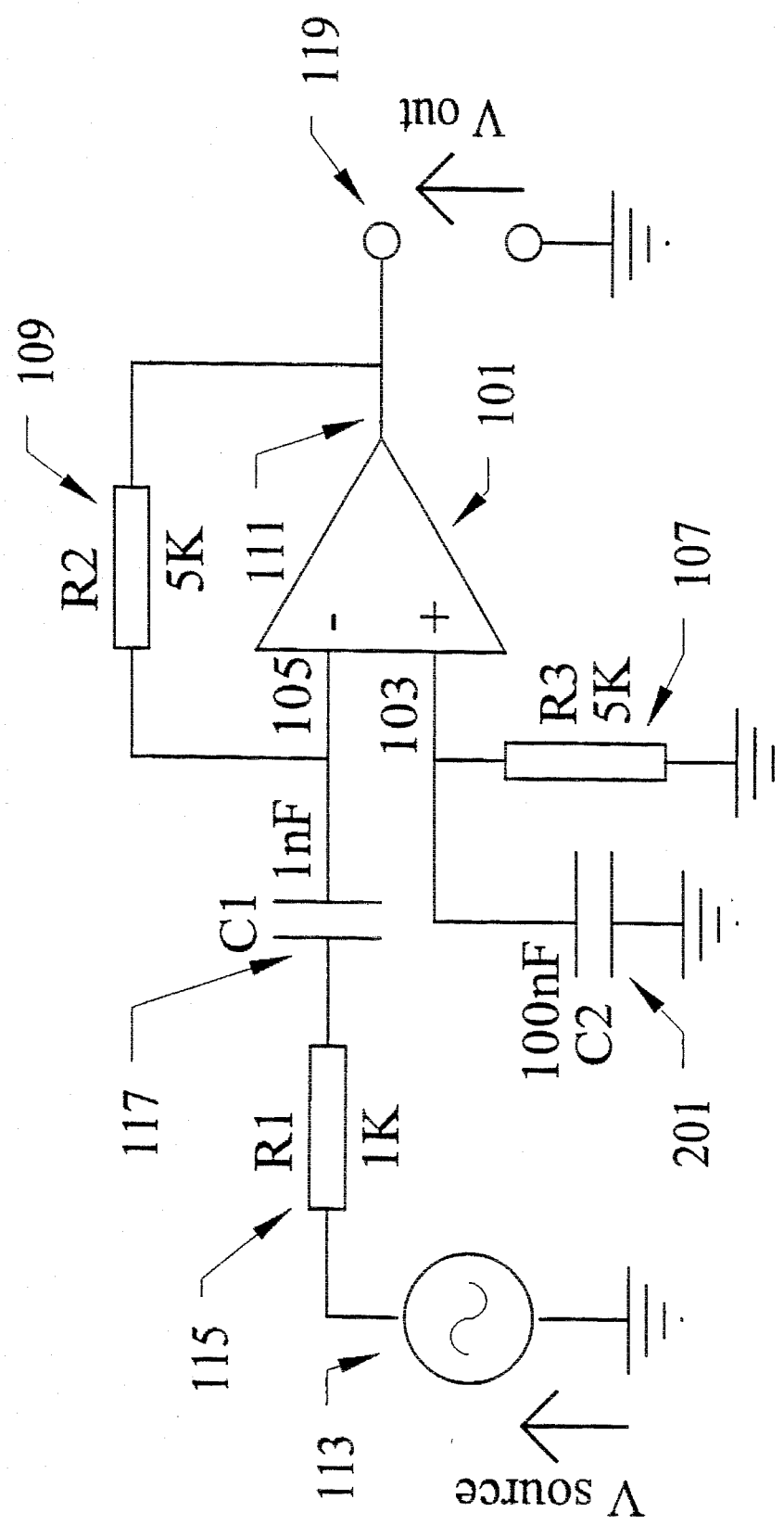
FIG. 2 illustrates the present invention where a high frequency bypass is placed in parallel with the non-inverting input bias circuit.

FIG. 2 illustrates the operational amplifier of FIG. 1 modified according to the present invention. This amplifier is particularly useful over a frequency range of 100KHz to 10MHz. As illustrated, a high frequency bypass capacitor C2 (201) is placed in parallel with the non-inverting bias resistor R3 (107). C2 reduces the noise contribution of the non-inverting bias circuit at high frequencies (f>½*3.142*R3*C2).

At DC (0 Hz), the impedance of the input non-inverting bias circuit (R3 and C2) matches that of the impedance at the amplifier's inverting input 105. That is the value of R2 equals the value of R3. As the impedance of the parallel combination of the input and feedback networks is substantially the same as thee impedance of the non-inverting input bias circuit at DC, the amplifier output 119 still has essentially a zero offset voltage for a zero input voltage. The non-inverting input bias circuit is designed to have a low bandwidth so that at high frequencies the impedance of the circuit is low. At frequencies above the bandwidth of the non-inverting input bias circuit, the noise contribution of this circuit is reduced when compared to the bias circuit of FIG. 1. For the circuit illustrated in FIG. 2, the noise contributions of the non-inverting input bias circuit (C2 and R3) are given by the formulas:

Johnson Noise=sqrt(4KT*R3/(1+(2*3.142*f*R3*C2)$^2$)) volts per root Hz.

Input Current Noise=I$_{13}$noise*R3/(1+2*3.142*f*R*C2) volts per root Hz.

Where f is the input signal frequency.

At frequencies above the bandwidth of the non-inverting input bias circuit (f >½*3.142*R3*C2), the Johnson Noise and the Input Current Noise associated with the non-inverting input bias circuit rapidly decrease.

The addition of the high frequency bypass capacitor C2 (201) reduces the bandwidth of the non-inverting input bias circuit and thereby reduces the noise at the amplifier output.

The present invention, by reducing the bandwidth of the non-inverting input Input Current Noise=I_noise*R3/sqrt(1+(2*3.142*f*R3*C2)^2) volts per root Hz without introducing an offset voltage at the amplifier output due to unbalanced input bias currents and without reducing the value of the feedback or input resistors of the amplifier.

While a preferred embodiment of the invention has been described, other embodiments of the invention will be apparent to those skilled in the art from a consideration of this specification or practice of the invention disclosed herein. Therefore it is intended that the specification and example be considered as exemplary only, with the scope of the invention being defined by the following claims.

I claim:

1. An operational amplifier apparatus, having an output and having an inverting input and a non-inverting input, comprising:

a feedback network from the output to the inverting input;

an input network in series between an input signal source and the inverting input;

a non-inverting input bias circuit, having an inherent impedance at a particular frequency, connected in series between the non-inverting input and a reference voltage level;

a high frequency bypass device connected in parallel across the non-inverting input bias circuit; and the high frequency bypass device has a lower inherent impedance at the particular frequency than the non-inverting input bias circuit such that the combined impedance of the non-inverting bias circuit and the high frequency bypass device is less than the inherent impedance of the non-inverting bias circuit at the particular frequency, reducing the bandwidth of said non-inverting input bias circuit, and thereby limiting the amount of noise voltage developed across the non-inverting input bias circuit for a particular noise current flowing into the non-inverting input of the operational amplifier and thereby reducing the Johnson noise generated by the non-inverting input bias circuit.

2. An operational amplifier apparatus as in claim 1 wherein: the high frequency bypass device is a capacitor.

3. An operational amplifier apparatus as in claim 1 wherein:

at DC (0 Hz) the impedance of the parallel combination of the input and feedback networks is substantially the same as the impedance of the non-inverting input bias circuit at DC, such that the output of the operational amplifier has essentially a zero offset voltage for a zero input voltage.

4. An operational amplifier apparatus, having an output and having an inverting input and a non-inverting input, comprising:

a non-inverting input bias circuit, having an inherent impedance at a particular frequency, connected in series between the non-inverting input and a reference voltage level;

a feedback network connected between the output and the inverting input;

an input network in series between an input signal source and the inverting input such that at DC (0 Hz) the impedance of the parallel combination of the input and feedback networks is substantially the same as the impedance of the non-inverting input bias circuit at DC;

a capacitor C1 connected in parallel across the non-inverting input bias circuit; and the capacitor has a lower inherent impedance at the particular frequency than the non-inverting input bias circuit such that the combined impedance of the non-inverting bias circuit and the capacitor is less than the inherent impedance of the non-inverting bias circuit at the particular frequency, reducing the bandwidth of said non-inverting input bias circuit, and thereby limiting the amount of noise voltage developed across the non-inverting input bias circuit for a particular noise current flowing into the non-inverting input of the operational amplifier and thereby reducing the Johnson noise generated by the non-inverting input bias circuit.

5. An operational amplifier apparatus as in claim 4 wherein:

the non-inverting bias circuit includes a resistor R1 connected in series between the non-inverting input and the reference voltage level; and the particular frequency is a frequency (f) greater than f=(½3.142*R1*C1).

6. An operational amplifier apparatus, having an output and having an inverting input and a non-inverting input, comprising:

a feedback network from the output to the inverting input;

an input network in series between an input signal source and the inverting input;

a non-inverting input bias circuit, having an inherent impedance at a particular frequency, connected in series between the non-inverting input and a reference voltage level;

a high frequency bypass device connected in parallel across the non-inverting input bias circuit; and the high frequency bypass device has a lower inherent impedance at the particular frequency than the non-inverting input bias circuit such that the combined impedance of the non-inverting bias circuit and the high frequency bypass device is less than the inherent impedance of the non-inverting bias circuit at the particular frequency thereby limiting the amount of noise voltage developed across the non-inverting input bias circuit for a particular noise current flowing into the non-inverting input of the operational amplifier and thereby reducing the Johnson noise generated by the non-inverting input bias circuit;

wherein at DC (0 Hz) the impedance of the parallel combination of the input and feedback networks is substantially the same as the impedance of the non-inverting input bias circuit at DC, such that the output of the operational amplifier has essentially a zero offset voltage for a zero input voltage.

7. An operational amplifier apparatus, having an output and having an inverting input and a non-inverting input, comprising:

a non-inverting input bias circuit, having an inherent impedance at a frequency (f) greater than $f=(\frac{1}{2}*3.142*R1*C1)$, and including a resistor R1 connected in series between the non-inverting input and a reference voltage level;

a feedback network connected between the output and the inverting input;

an input network in series between an input signal source and the inverting input such that at DC (0 Hz) the impedance of the parallel combination of the input and feedback networks is substantially the same as the impedance of the non-inverting input bias circuit at DC;

a capacitor C1 connected in parallel across the non-inverting input bias circuit; and the capacitor has a lower inherent impedance at the particular frequency than the non-inverting input bias circuit such that the combined impedance of the non-inverting bias circuit and the capacitor is less than the inherent impedance of the non-inverting bias circuit at the particular frequency thereby limiting the amount of noise voltage developed across the non-inverting input bias circuit for a particular noise current flowing into the non-inverting input of the operational amplifier and thereby reducing the Johnson noise generated by the non-inverting input bias circuit.

* * * * *